(12) United States Patent
Beer et al.

(10) Patent No.: US 7,162,663 B2
(45) Date of Patent: Jan. 9, 2007

(54) TEST SYSTEM AND METHOD FOR TESTING MEMORY CIRCUITS

(75) Inventors: Peter Beer, Tutzing (DE); Alan Morgan, Stockton-on-Tees (GB)

(73) Assignee: Infineon Technologies AG, Munich (DE)

( * ) Notice: Subject to any disclaimer, the term of this patent is extended or adjusted under 35 U.S.C. 154(b) by 529 days.

(21) Appl. No.: 10/676,588

(22) Filed: Oct. 1, 2003

(65) Prior Publication Data
US 2004/0062102 A1 Apr. 1, 2004

(30) Foreign Application Priority Data
Oct. 1, 2002 (DE) .................. 102 45 713

(51) Int. Cl.
*G06F 11/00* (2006.01)
(52) U.S. Cl. ............................................. 714/29
(58) Field of Classification Search .................. 714/29, 714/30, 31, 42, 32
See application file for complete search history.

(56) References Cited

U.S. PATENT DOCUMENTS

| | | | |
|---|---|---|---|
| 5,046,049 A * | 9/1991 | Choi et al. ............... 365/201 |
| 5,388,104 A * | 2/1995 | Shirotori et al. ............ 714/718 |
| 5,561,639 A * | 10/1996 | Lee et al. ............. 365/230.06 |
| 5,646,948 A | 7/1997 | Kobayashi et al. |
| 6,108,252 A | 8/2000 | Park |
| 6,115,833 A | 9/2000 | Sato et al. |
| 6,198,667 B1 * | 3/2001 | Joo ........................ 365/189.04 |
| 6,550,026 B1 * | 4/2003 | Wright et al. ............... 714/719 |
| 2003/0065997 A1 * | 4/2003 | Yamazaki et al. .......... 714/718 |

* cited by examiner

*Primary Examiner*—Nadeem Iqbal
(74) *Attorney, Agent, or Firm*—Laurence A. Greenberg; Werner H. Stemer; Ralph E. Locher

(57) ABSTRACT

A first and a second memory circuit are tested in parallel. It is possible to activate the memory circuits depending on a circuit select signal, and it is possible to apply a control signal to the first and second memory circuits. The control signal initiates a function in the respective memory circuit depending on the activation of the first or second memory circuit. In testing the memory circuits, the circuit select signal is applied to the first memory circuit and the inverted circuit select signal is applied to the second memory circuit, so that the function is initiated in the first or in the second memory circuit depending on the circuit select signal.

8 Claims, 4 Drawing Sheets

FIG. 1 - PRIOR ART

TEST SYSTEM AND METHOD FOR TESTING MEMORY CIRCUITS

BACKGROUND OF THE INVENTION

FIELD OF THE INVENTION

The invention relates to a test system for the parallel testing of memory circuits and to a method therefor.

The production process of integrated memory modules comprises two test sections. After the complete processing of integrated memory circuits, the memory circuits are firstly tested in a first test section in the unsawn state on the substrate wafer (front end test). This test serves for detecting defective memory cells or memory areas and replacing the latter, if possible, by functional memory areas provided in redundant fashion. This is usually performed by programming switches that are to be set permanently (e.g. fuses), which switch off the defective memory area and switch on a defect-free memory area provided in redundant fashion and make it addressable by means of the same address as the defective memory area.

After the substrate wafers have been sawn in order to obtain individual integrated memory circuits (a process referred to as dicing), the singulated memory circuits are each inserted into housings and connected to the housing terminals via so-called bonding wires or the like. The memory modules thus produced are checked once more in a second test section, in the so-called back end test, in order to ascertain whether further defects have occurred during the production steps following the front end test. Whereas in the front end test what is important in the case of the defect information is the address or address range at which the defect occurred, in order to repair the latter, in the back end test all that is important is whether or not the memory circuit is completely free of defects. This is sufficient since repair is no longer possible after the integrated memory circuits have been housed.

In order to increase the throughput of tested memory circuits, the circuits are tested in parallel both during the front end test and during the back end test. For this purpose, the memory circuits are connected to a test system via common signal lines. In this case, all the memory circuits to be tested are essentially connected to the test system via common lines, so that a signal applied by the test system is present at all the connected memory circuits. Only for reading out the test result is it possible to read the data individually from the connected integrated memory circuits.

In order to support the testing, the integrated memory circuits usually have so-called BIST circuits (Built-In Self-Test). With these, test data can be generated within the memory circuits, so that self-generated test data are written to the memory circuits after the start of a test method.

Since all the integrated memory circuits are connected to common signal lines, the writing of test data is carried out simultaneously in all the integrated memory circuits. However, since the respectively assigned defect information is required from each individual memory circuit, the signal lines for the data to be communicated between test system and memory circuit are usually routed individually for each of the memory circuits. In this way, the evaluated result is transmitted to the test system in parallel via data signal lines.

SUMMARY OF THE INVENTION

It is accordingly an object of the invention to provide a test system and a test method which overcome the above-mentioned disadvantages of the heretofore-known devices and methods of this general type and which render it is possible to accelerate the testing of integrated memory circuits both in the front end test and in the back end test.

With the foregoing and other objects in view there is provided, in accordance with the invention, a test system for testing a first memory circuit and a second memory circuit in parallel, the test system comprising:

a tester unit configured to generate a circuit select signal for activating the first and second memory circuits to receive signals in dependence on the circuit select signal;

the first memory circuit and the second memory circuit each having a test data generator circuit for generating test data for writing to memory cells of the respective memory circuit; and wherein the first memory circuit and the second memory circuit are connected to the tester unit in such a way as to simultaneously apply the circuit select signal to the first memory circuit in inverted form and to the second memory circuit in noninverted form.

In accordance with an added feature of the invention, an inverter unit is connected between the first memory circuit and the tester unit.

In accordance with an additional feature of the invention, there are provided a plurality of first memory circuits and/or a plurality of second memory circuit.

In accordance with another feature of the invention, the first and/or the second memory circuit is a DRAM memory circuit.

That is, a first aspect of the present invention provides a test system for the parallel testing of a first and a second memory circuit. The test system has a tester unit, to which the first and second memory circuits are connected in order to activate the first and second memory circuits for the reception of signals depending on a circuit select signal generated by the tester unit. The first and second memory circuits each have a data generator circuit in order to generate test data for writing to memory cells of the memory circuits. The first and second memory circuits are connected to the tester unit in such a way as to simultaneously apply the circuit select signal to the first memory circuit in inverted form and to the second memory circuit in noninverted form.

The test system according to the invention has the advantage that, in the case of a circuit select signal generated jointly by the test system, only either the first or the second memory circuit is activated, so that only one of the memory circuits is ready for receiving further test commands. In other words, as a result of a change in state of the circuit select signal, one of the memory circuits is deactivated and the respective other memory circuit is activated. The circuit select signal is designed in such a way that it selects the entire memory circuit and only thus enables the reception of defects, in particular test commands. In this way, by means of a changeover in the circuit select signal, it is possible to drive the first and second memory circuits alternately with test commands. Thus, after the start of an operation in the first memory circuit, the circuit select signal is changed and test commands are applied to the second memory circuit or data are read from the second memory circuit, while internal writing to memory areas is carried out in the first memory circuit under the control of the test data generator circuit (BIST circuit).

With the above and other objects in view there is also provided, in accordance with the invention, a method for testing a first and a second memory circuit, which comprises:

providing first and second memory circuits each configured to be activated in dependence on a circuit select signal;

enabling the first and second memory circuits to receive a control signal, the control signal initiating a function in the respective memory circuit depending on an activation of the first or second memory circuit;

for testing the memory circuits, applying the circuit select signal to the first memory circuit and applying the circuit select signal in inverted form to the second memory circuit, for initiating the function in the first or in the second memory circuit depending on the circuit select signal.

In accordance with again an added feature of the invention, the control signal is applied to a signal input of the respective memory circuit.

In accordance with again another feature of the invention, the circuit select signal is set to a first state for activating the first memory circuit and for deactivating the second memory circuit; similarly, the circuit select signal is set to a second state for activating the second memory circuit and deactivating the first memory circuit in the second state.

In accordance with a concomitant feature of the invention, the control signal is a signal from the group of RAS signals, CAS signals, and a WE signal.

That is, the invention also provides for a method for testing a first and a second memory circuit. The memory circuits can be deactivated depending on a circuit select signal. For testing the memory circuits, the circuit select signal is applied to the first memory circuit and the inverted circuit select signal is applied to the second memory circuit, so that a function is initiated in the first or in the second memory circuit depending on the circuit select signal.

Provision is made, therefore, for sending test commands to the first and second memory circuits in an interleaved manner, so that a processing of a test function is carried out within the integrated memory circuit if test commands are sent to the respective other memory circuit or data are read from the respective other memory circuit. Thus, by way of example, the test data generator circuit contained in the memory circuits can be instructed to write test data to a memory area. As soon as the corresponding command is sent to one of the memory circuits, it is possible during this time, namely while the internal test data generator circuit writes test data to a memory area, for test data to be read from respective other memory circuits and for the defect data determined therefrom from a comparison with desired data to be transmitted to the connected tester device. In this way, the test time can be considerably reduced because the respective process of writing to and reading from memory areas in the integrated memory circuits proceeds in an interleaved manner. As a result, defect data of the first memory circuit and defect data from the second memory circuit are transmitted to the test system virtually directly in succession.

In particular, this method is suitable for characterizing the retention time with the aid of a so-called March 12 test method. The retention time is the time in which the information of a DRAM memory cell can be reliably read out if the content of the memory cell is not refreshed in the meantime. The March 12 test method provides for a test datum to be written completely to the memory area and then for the latter to be read area by area and for an inverse datum to be written to it again. This is carried out until the inverse datum has been written twice to each memory area of the integrated memory circuits, so that, given freedom from defects, the original data are stored in the memory areas. During such a test sequence, write and read operations alternate for the individual memory areas so that the March 12 test method is suitable for addressing the first and second memory circuits in an interleaved manner.

It is advantageously provided that one of the memory circuits is connected to the tester unit via an inverter unit. The circuit select signal is usually made available to the connected integrated circuits to be tested via a line. In order to address the memory circuits alternately, provision may be made for providing an inverter between the terminal of the first memory circuit and the terminal of the second memory circuit for the circuit select signal.

Other features which are considered as characteristic for the invention are set forth in the appended claims.

Although the invention is illustrated and described herein as embodied in a test system and method for testing memory circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
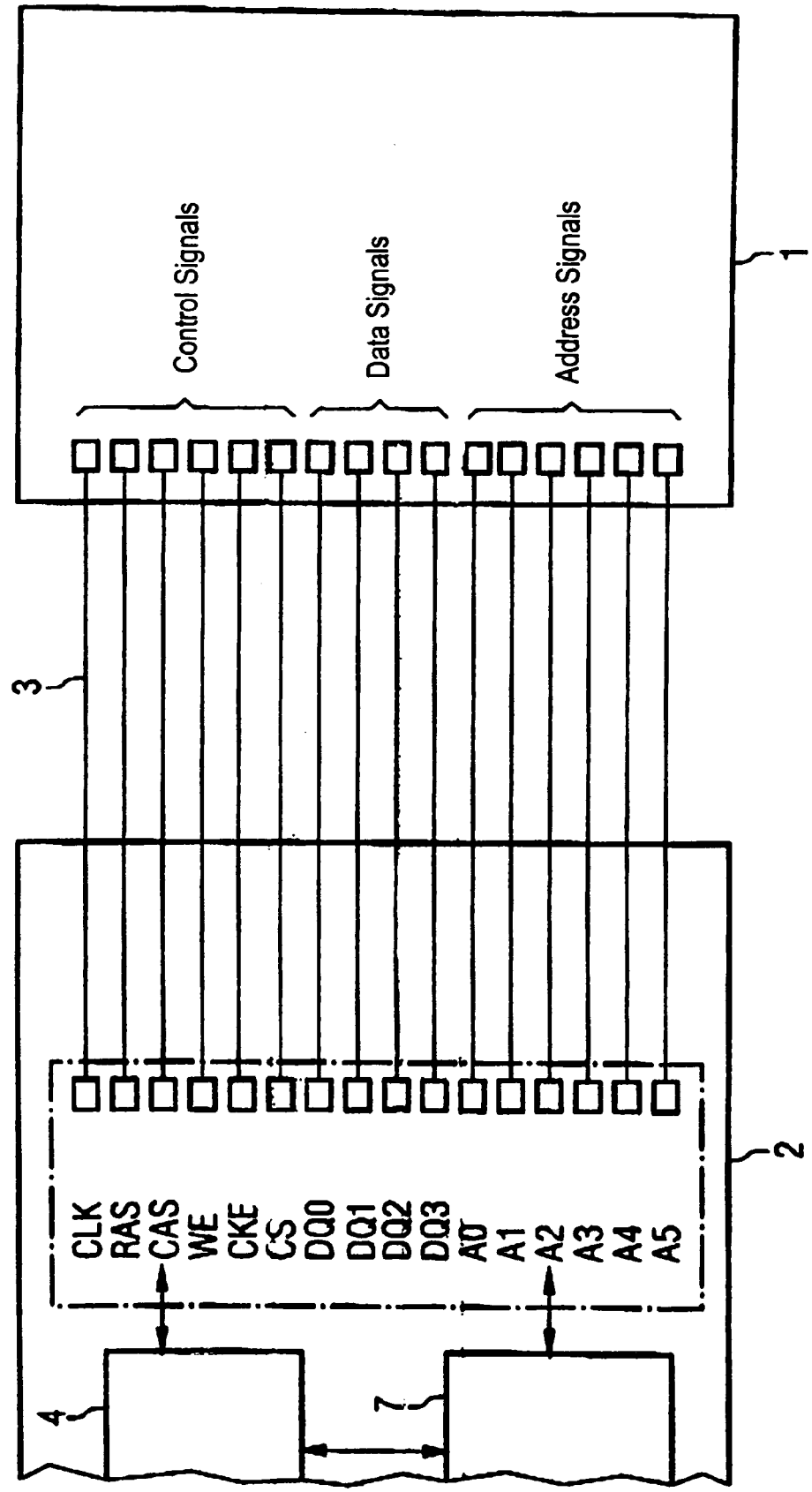
FIG. 1 shows a test system for testing a chip in accordance with the prior art.

Referring now to the figures of the drawing in detail and first, particularly, to FIG. 1 thereof, there is shown a schematic illustration of a test system in which a tester device 1 is connected to an integrated synchronous DRAM memory module 2 to be tested, which has a memory cell array. The connection to the integrated memory module 2 is effected via signal lines 3 in order to supply the memory module 2 with control signals, data signals and address signals. The control signals are, by way of example, the clock signal CLK, the word line activation signal RAS, the bit line activation signal CAS, the write signal WE, the circuit select signal CS and the clock activation signal TKE. The signals are applied to the memory circuit for driving and are accepted with the rising edge of the clock signal CLK.

The data signals generated by the test device 1 are applied to the data inputs/outputs DQ0–DQ3. The address signals are applied to the address inputs A0–A5. It is also possible for more than one integrated memory module to be connected to the tester device 1. It is then essentially the case that all the signal lines are also connected to the rest of the memory modules in parallel in the same way. Only the data outputs of the integrated memory modules are passed to the tester device 1 via separate lines, in order to obtain a parallelism during the testing of the integrated memory circuits.

The test device 1 writes data to the memory module 2 in the following way: firstly the circuit select signal CS must be activated in order that the memory module 2 detects the further control signals present. Upon the rising clock edge, with the activated word line activation signal RAS, a first address, called X address hereinafter, is read in via the address inputs A0–A5. The X address determines the position of the word line to be activated in the memory cell array of the memory circuit 2.

After the activation of the word line, the bit line activation signal CAS and also the write signal WE are likewise activated, a further address, the so-called Y address being accepted into the integrated memory circuit 2 with the aid of the bit line activation signal CAS. The Y address, also called bit line address, determines the read/write amplifier via which the data present are to be written to the memory cells. The write signal WE serves for driving the read/write amplifiers, so that the latter are switched for writing to the memory cells. After a specific time duration required for writing, word line activation signal RAS and bit line activation signal CAS are deactivated, and the write operation is concluded. The control signals are always accepted with the rising edge of the clock signal CLK.

When data are read from the memory module 2 it is likewise necessary firstly for the circuit select signal CS to be activated and then for the word line activation signal RAS to be activated, so that the information stored in the memory cells flows as charge onto the bit lines. The sense amplifiers arranged on the bit lines amplify the charge, so that the datum stored in the memory cells can be tapped off at the sense amplifiers. With an activated word line activation signal RAS, a first X address is likewise accepted, as in the case of the write operation, via the address inputs A0–A5 with the rising clock edge. Afterward, with the write signal WE still deactivated, the bit line activation signal is activated, so that a bit line address (Y address) which is then applied to the address inputs is accepted, so that the sense amplifier connected to the addressed memory cells applies the read-out datum to the data inputs/outputs DQ0–DQ3. These data can then be read out via the test device 1.

The memory module 2 furthermore contains a test data generator circuit 4 which is able to generate test data for writing to the memory cell array of the memory module 2 depending on a command sent by the test device 1 via the signal lines 3. As soon as a corresponding test command has been received, the test data generator circuit 4, in accordance with the sequence previously described, thus writes test data to the entire memory or to a memory area selected by an address prescribed by the test device. The word line activation signal RAS, the bit line activation signal CAS and the write signal WE are generated internally and applied to the memory cell array. At the same time the signals sent by the test device are ignored. As a result, it is not necessary for the test device to send test data to be written via the signal lines 3, in particular the data lines, so that the test data bus formed by the signal lines 3 is not burdened with the transmission of data.

Figure 2:
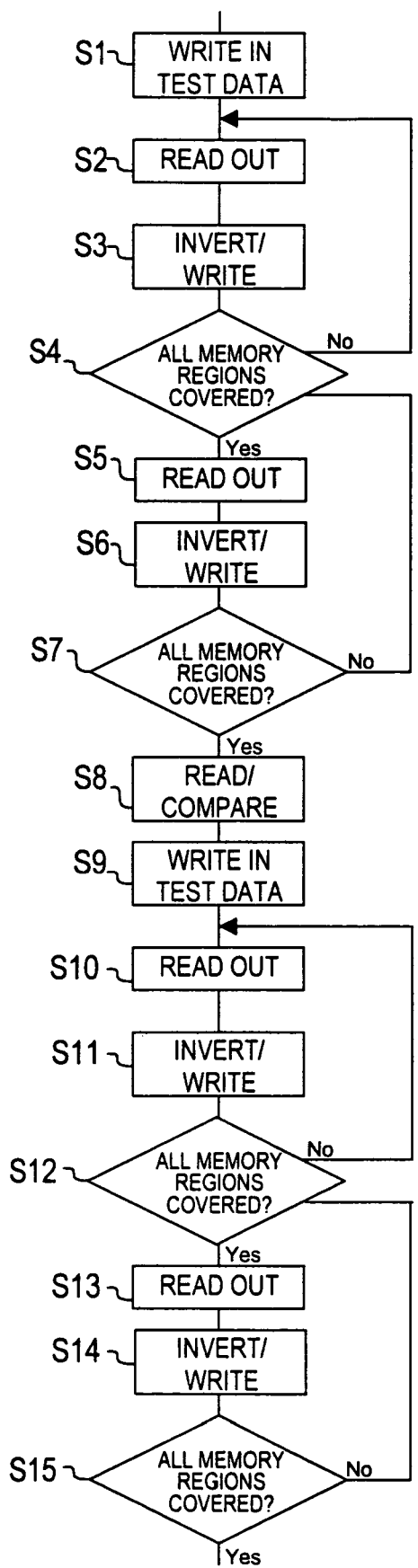
FIG. 2 shows a flow diagram for illustrating a test sequence in accordance with a conventional March 12 method.

FIG. 2 illustrates a flow diagram of a test sequence for a March 12 test method. In this test method, it is provided that firstly test data are written to the entire memory (step S1). These test data are subsequently read out area by area, a defect being identified if the written-in data and the data read from the memory area do not correspond. After the data have been read from a memory area (step S2), the test data are inverted bit by bit and rewritten to the respective memory area (step S3). This is carried out in accordance with the interrogation of step S4 until all the memory areas of the memory have successively been read and had the respective inverse data rewritten to them. Afterward, the test data stored in the memory areas are read out again (step S5), inverted bit by bit and rewritten to the respective memory area in step S6. This is carried out in accordance with the interrogation in step S7 until all the memory areas have been read and written to in order. Afterward, the entire memory is read and compared with the written-in data (step S8).

In steps S1 to S8, the read-out, inversion of the test data and the rewriting are carried out with ascending address values for all the memory areas. The March 12 test sequence provides for this test to be carried out firstly with ascending address sequences for all the memory areas and then with descending address sequences for all the memory areas. Thus, step S8 is followed by steps S9 to S16, which are substantially identical to steps S1 to S8, but the reading from the memory areas is begun with the memory area having the highest address and ends with the lowest address, that is to say in opposite fashion to the first part of the test sequence in accordance with steps S1 to S8.

This test sequence is controlled with the aid of the test data generator circuit 4. The test data generator circuit 4 is utilized for writing predetermined test data to the memory, in accordance with steps S1 and S9. The test data generator circuit 4 generates the test data to be written and makes comparison data available during a read-out of the test data in order to compare the test data read out with the data previously written to the memory cells.

Since the test data are generated completely within the integrated memory module, the transmission of test pattern data to be written to the memory cell array 6 from the tester device to the memory module to be tested is obviated. During read-out, under the control of the test data generator circuit 4, the data read out are compared with the data previously written in e.g. in a non-illustrated comparator unit and an item of defect information is generated therefrom, which information specifies whether the written-in and read-out data differ from one another.

The defect data have to be transmitted to the tester device 1 for evaluation in order that the tester device 1 can ascertain the location at which or the memory area of the memory module in which a defect has occurred. This is necessary in order that the tester device can carry out a redundancy calculation whose result specifies how the defective memory area is to be replaced by a redundant non-defective memory area.

Thus, the data lines between the memory module to be tested and the tester device 1, i.e. the signal lines connected to the data inputs/outputs DQ0–DQ3, are only utilized for the read-out of defect data. Writing and read-out cannot be effected in parallel on-chip. Since the generation of test data by the internal test data generator circuit and the writing of the test data to the relevant memory areas likewise take up time, the test data bus cannot be utilized for the read-out of defect data to the tester device during this time.

Figure 3:
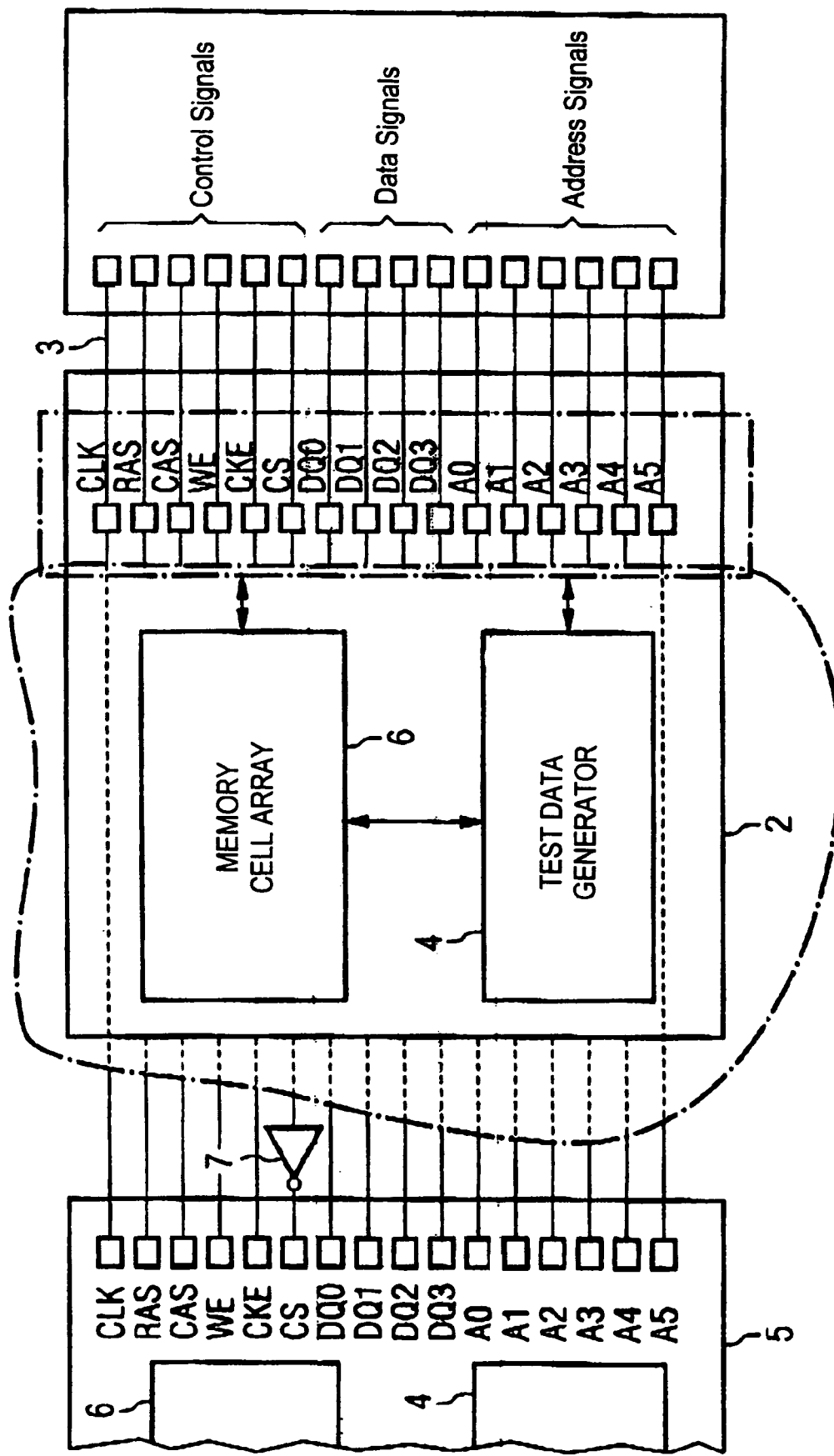
FIG. 3 shows a test system for testing two chips in accordance with an embodiment of the invention.

FIG. 3 illustrates a test system in accordance with a preferred embodiment of the invention. It likewise has the test device 1, which is connected via the signal lines 3 to a first memory module 2 to be tested and a second memory module 5 to be tested. Except for the signal line of the circuit select signal CS, all the terminals of the memory modules 2, 5 to be tested with the same function are connected via the same signal lines to the tester device 1. The signal line for the circuit select signal CS has an inverter 7 between the corresponding terminals of the first and second memory modules, so that the circuit select signal CS is present in noninverted form at the first memory module 2 and in inverted form at the second memory module 5.

What is achieved in this way is that the tester device 1 always keeps one of the two connected memory modules activated, while the respective other module is deactivated. The control signals present are then only accepted by the memory module if the corresponding state is present at the signal input thereof for the circuit select signal CS. If the circuit select signal is at a high state, then a high state is likewise present at the first memory module 2, at the input for the circuit select signal CS. As a result, the first memory module is deactivated since the circuit select signal CS is an active low signal.

At the same time, a low state is present at the signal input for the circuit select signal CS of the second memory module 5, as a result of which the second memory module 5 is activated for receiving control signals via the remaining signal inputs. If the state of the circuit select signal CS changes from the high state to the low state, then the first memory module 2 is activated for receiving control signals, while the second memory module 5 is deactivated.

Figure 4:
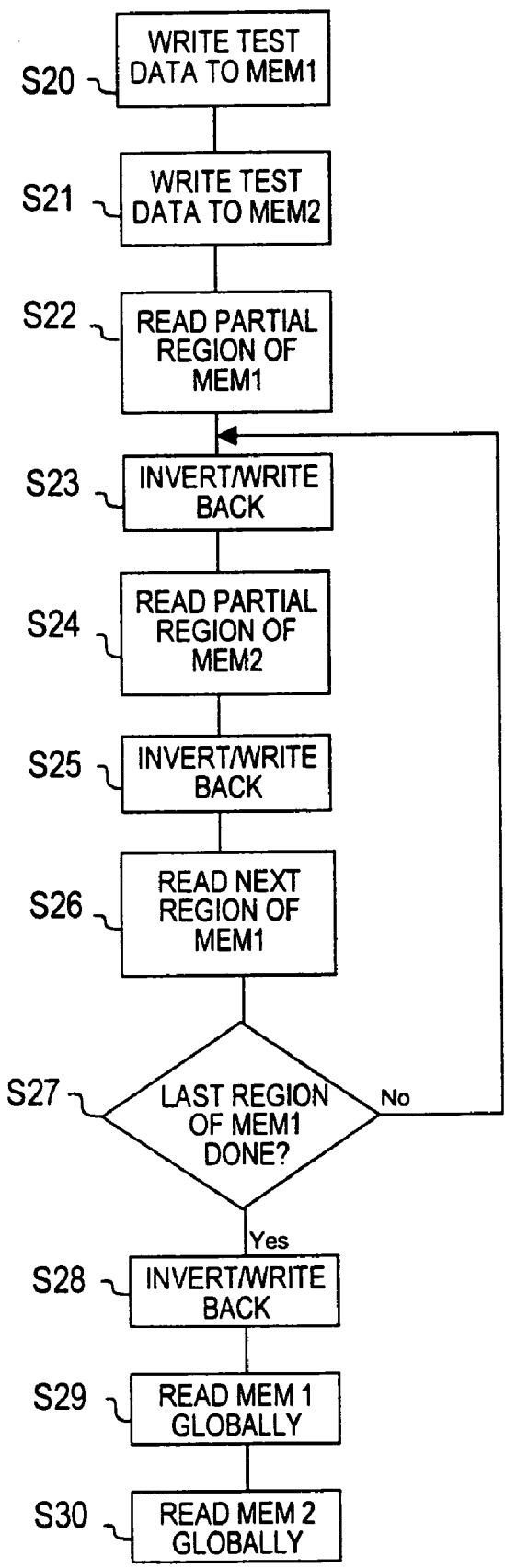
FIG. 4 shows a flow diagram for illustrating a test method according to the invention for a March 12 test sequence.

FIG. 4 illustrates a flow diagram for an embodiment of the method according to the invention. The method is carried out with the aid of the embodiment illustrated in FIG. 3 for the test system according to the invention. A prerequisite, then, is a first memory module 2 and a second memory module 5 which are connected to a tester device 1, the circuit select signal CS being applied to the second memory module 5 in inverted form.

In accordance with the first step S20, firstly the entire memory of the first memory module 2 is written to. To that end, the circuit select signal CS is brought to a low state, as a result of which the first memory module 2 is activated for receiving test signals. The tester device 1 then sends test signals to the first memory module 2, which activate the test data generator circuit 4 in order to write test data to the entire memory in accordance with a March 12 method. During the process of writing to the first memory module 2, no read or write operation is carried out in the second memory module 5. The test data may be e.g. data in accordance with a checkerboard pattern or exclusively logic zeros or logic ones. Other test data patterns are also conceivable.

Directly after the start of the global writing of the test data to the memory cell array of the first memory module 2, the circuit select signal CS is changed from the low state to the high state, as a result of which the first memory module is deactivated and the second memory module 5 is activated. Since the circuit select signal CS only controls the acceptance of test signals into the memory module, the global writing to the memory cell array of the first memory module 2 is not stopped by the change in the circuit select signal CS.

After the activation of the second memory module 5, there too the test data generator circuit 4 is instructed to globally write to the memory test data generated by the test data generator circuit in accordance with a previously selected test method (step S21).

As an alternative, steps S20 and S21 can also be carried out in an interleaved manner, i.e., in accordance with a burst access, firstly a burst start address is transferred to the first memory module 2 and, while test data are being written to a memory area defined by the burst start address, a process of writing to a memory area determined by a further burst start address in the second memory module 5 is performed. Thus, essentially the global writing to the first memory module 2 and the second memory module 5 can be carried out in parallel.

After the global writing to the first memory module 2 has ended after a defined time duration required for this, firstly a memory area of the first memory module 2 is read (step S22). The test data read out are inverted bit by bit and written back to the corresponding memory area of the first memory module 2 (step S23).

In step S24, through changeover of the circuit select signal CS, the second memory module 5 is then activated (and the first memory module 2 is deactivated) and test data are read from one of the memory areas. In this case, there is no waiting until the operation—started in step S23—of writing to a memory area of the first memory module 2 has ended, rather as soon as the write operation is started a jump is made to step S24 in order to read the test data stored there from the relevant memory area. In this way, the method steps S23 in the first memory module and the method step S24 in the second memory module 5 proceed substantially simultaneously.

In a step S25, the test data read from the memory area of the second memory module 5 are inverted bit by bit and rewritten to the corresponding memory area of the second memory module 5. The bit-by-bit inversion of the test data and the writing of the modified data to the second memory module 5 are effected without the assistance of the tester device 1, so that the tester device 1, through renewed changeover of the circuit select signal CS, can then send a test command to the first memory module 2 without interrupting or disturbing the write operation in the second memory module. In a step S26, a renewed read-out command is sent for a memory area whose address is the address of the memory area previously read in step S22 that has been increased by an address step.

In a step S27, an interrogation is then carried out to determine whether the last addressable memory area of the first memory module 2 has now been read. If there are still further memory modules to be read, then the data read out are again inverted bit by bit and written back in modified form to the corresponding memory area. Steps S23 to S26 are carried out until there are no further memory areas to be processed in accordance with the cycle of reading-modification-writing.

If the last addressable memory area of the first memory module 2 has been read, then in a subsequent step S28 the test data read from the test memory module 2 are inverted bit by bit and these modified test data are written to the last addressable memory area (step S28). Afterward, the data written to the memory modules 2, 5 are read out globally in steps S29 and S30.

What is primarily important to the method according to the invention is that the write command for the writing of the modified test data by the test data generator circuit 4 is essentially sent near to the time of, in particular shortly before, a read-out command for a memory area for the respective other memory module from the tester device. The respective processes in the first memory module 2 and the second memory module 5 then run essentially in parallel, namely the writing of test data to a memory area of one memory module and the reading of defect data from a memory area of the respective other memory module.

This is possible since the test data bus is only used for the read-out of defect data, but not for the transmission of test data to be used to the memory modules. In essence, the invention therefore provides for test commands to be sent to the first memory module 2 and to the second memory module 5 in an interleaved manner in order thus to utilize the times in which the data line would not be utilized during simple testing for the transmission of defect data of a respective other memory module to be tested.

In this way, the time duration for testing two integrated memory modules connected thus to the test device is only slightly more than the time required for testing one memory module according to the conventional method.

For the tester device, it must be taken into account that only the burst start address is transferred in the event of a write access. In the event of a read-out operation, during the burst the Y address must also additionally be counted correctly in the test device in order to correctly store the defects in a defect address memory of the tester device 1. However, this is only necessary in the front end test since only there is it necessary for the address at which the defect occurred to be available in the test device 1. The address then serves for calculating a redundancy solution for the repair of the defective memory.

After the repair of the memory circuit, the back end test method only requires the defect data information which specifies whether the memory module is functional or defective.

In the back end test, in contrast to the front end test, it is not necessary to transmit the defect data for each address of the memory area read to the test device 1. However, since read and write accesses have to be carried out within the integrated memory modules even when it is only necessary to check that the respective integrated memory module to be tested is free of defects, the test methods for the front end testing and the back end testing are essentially similar. The only difference is that in the back end test the defect data to be transmitted to the tester device do not have to be assigned to an address.

We claim:

1. A test system for testing a first memory circuit and a second memory circuit in parallel, the test system comprising:
 a tester unit configured to generate a circuit select signal for activating the first and second memory circuits to receive signals in dependence on the circuit select signal;
 the first memory circuit and the second memory circuit each having a test data generator circuit for generating test data for writing to memory cells of the respective memory circuit, said tester unit, the first memory circuit and the second memory circuit all being separate units to be releaseably connected to each other only for testing purposes; and
 wherein the first memory circuit and the second memory circuit are connected to said tester unit in such a way as to simultaneously apply the circuit select signal to the first memory circuit in inverted form and to the second memory circuit in noninverted form.

2. The test system according to claim 1, which comprises an inverter unit connected between the first memory circuit and said tester unit.

3. The test system according to claim 1, connected to and configured to test a plurality of first memory circuits and/or a plurality of second memory circuit.

4. The test system according to claim 1, wherein at least one of the first and second memory circuits is a DRAM memory circuit.

5. A method for testing a first and a second memory circuit, which comprises:
 providing first and second memory circuits each configured to be activated in dependence on a circuit select signal, the first and second memory circuits being separate test circuits not formed as/on a single memory chip and each being separately connected to a tester;
 enabling the first and second memory circuits to receive a control signal, the control signal initiating a function in the respective memory circuit depending on an activation of the first or second memory circuit;
 for testing the memory circuits, applying the circuit select signal to the first memory circuit and applying the circuit select signal in inverted form to the second memory circuit, for initiating the function in the first or in the second memory circuit depending on the circuit select signal.

6. The method according to claim 5, which comprises applying the control signal to a signal input of the respective memory circuit.

7. The method according to claim 5, which comprises setting the circuit select signal to a first state for activating the first memory circuit and deactivating the second memory circuit, and setting the circuit select signal to a second state for activating the second memory circuit and deactivating the first memory circuit in the second state.

8. The method according to claim 5, wherein the control signal is at least one signal selected from the group consisting of a RAS signal, a CAS signal, and a WE signal.

* * * * *